(12) United States Patent
Nomura et al.

(10) Patent No.: US 10,199,085 B2
(45) Date of Patent: Feb. 5, 2019

(54) SEMICONDUCTOR DEVICE

(71) Applicant: Renesas Electronics Corporation, Tokyo (JP)

(72) Inventors: Takao Nomura, Tokyo (JP); Ryo Mori, Tokyo (JP); Kazuki Fukuoka, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 14/817,777

(22) Filed: Aug. 4, 2015

(65) Prior Publication Data
US 2016/0064063 A1    Mar. 3, 2016

(30) Foreign Application Priority Data

Aug. 27, 2014 (JP) .................................. 2014-173067

(51) Int. Cl.
*G11C 11/406*    (2006.01)
*G11C 11/4074*   (2006.01)

(52) U.S. Cl.
CPC .. *G11C 11/40626* (2013.01); *G11C 11/40618* (2013.01); *G11C 11/4074* (2013.01); *G11C 2211/4068* (2013.01); *H01L 2224/16145* (2013.01); *H01L 2924/181* (2013.01)

(58) Field of Classification Search
CPC .......... G11C 11/40626; G11C 11/4074; G11C 11/40618; G11C 11/4068
See application file for complete search history.

(56) References Cited

U.S. PATENT DOCUMENTS

| 8,724,415 | B2 | 5/2014 | Kuroda |
| 8,873,325 | B2 | 10/2014 | Sakakibara et al. |
| 2006/0006166 | A1* | 1/2006 | Chen ................. G05D 23/1931 219/494 |
| 2006/0242447 | A1 | 10/2006 | Radhakrishnan et al. |
| 2006/0265610 | A1* | 11/2006 | Kim ..................... G06F 1/3203 713/300 |

(Continued)

FOREIGN PATENT DOCUMENTS

| CN | 103460382 A | 12/2013 |
| JP | 2007-220233 A | 8/2007 |

(Continued)

OTHER PUBLICATIONS

Communication dated Mar. 20, 2018, from the Japanese Patent Office in counterpart application No. 2014-173067.

(Continued)

*Primary Examiner* — Douglas King
(74) *Attorney, Agent, or Firm* — Sughrue Mion, PLLC

(57) ABSTRACT

A semiconductor device capable of controlling a memory while preventing the functional deterioration of the memory and reducing the power consumption of the semiconductor device is provided. The semiconductor device includes a first semiconductor chip (logic chip) and a second semiconductor chip (memory chip). The first semiconductor chip includes a plurality of temperature sensors disposed in mutually different places, and a memory controller that controls each of a plurality of memory areas provided in the second semiconductor chip based on output results of a respective one of the plurality of temperature sensors.

23 Claims, 14 Drawing Sheets

(56) References Cited

U.S. PATENT DOCUMENTS

| | | | |
|---|---|---|---|
| 2011/0205826 A1* | 8/2011 | Kuroda | G11C 11/406 365/222 |
| 2012/0163413 A1* | 6/2012 | Kim | G01K 7/01 374/152 |
| 2012/0249218 A1* | 10/2012 | Shoemaker | G01K 3/08 327/512 |
| 2013/0295697 A1* | 11/2013 | Hanan | G01R 31/2884 438/12 |
| 2014/0140156 A1* | 5/2014 | Shoemaker | G11C 7/04 365/201 |
| 2014/0183691 A1* | 7/2014 | Saraswat | H01L 23/481 257/531 |

FOREIGN PATENT DOCUMENTS

| | | |
|---|---|---|
| JP | 2011-170943 A | 9/2011 |
| JP | 2013-101728 A | 5/2013 |

OTHER PUBLICATIONS

Office Action dated Sep. 29, 2018 in Chinese Patent Application No. 2015105315182.

* cited by examiner

SEMICONDUCTOR DEVICE

CROSS-REFERENCE TO RELATED APPLICATIONS

This application is based upon and claims the benefit of priority from Japanese patent application No. 2014-173067, filed on Aug. 27, 2014, the disclosure of which is incorporated herein in its entirety by reference.

BACKGROUND

The present invention relates to a semiconductor device and, in particular, a semiconductor device including a temperature sensor.

As the integration density of components such as transistors in semiconductor devices has increased, there have been cases in which semiconductor devices have areas where the temperature rises locally due to heat generated by their operations. In related art, a temperature sensor is disposed in such a high-temperature area of a semiconductor device. Then, deterioration in functions of the semiconductor device is reduced by controlling the semiconductor device itself based on the output result from the temperature sensor.

For example, Japanese Unexamined Patent Application Publication No. 2007-220233 discloses a semiconductor chip including a temperature sensor that is disposed near a memory cell array and detects the temperature of the chip, an arithmetic circuit that processes the output from the temperature sensor, an oscillator, an output circuit, and a refresh circuit. Further, Japanese Unexamined Patent Application Publication No. 2007-220233 also discloses a mode setting circuit that makes a setting as to whether a refresh operation should be performed or not for each of sub-memory cell arrays that are formed by dividing the memory cell array.

Further, Japanese Unexamined Patent Application Publication No. 2013-101728 shows that a temperature sensor is disposed on an SoC (System on Chip) side.

Further, Japanese Unexamined Patent Application Publication No. 2011-170943 mentions that a logic side receives information of a temperature sensor disposed on a DRAM side.

SUMMARY

However, the present inventors have found the following problem. In the case where a plurality of semiconductor chips are coupled with each other, even if a temperature sensor is disposed in a place in one semiconductor chip where a temperature rises due to the operation of that semiconductor chip itself, this temperature sensor cannot necessarily detect heat transferred from a neighboring semiconductor chip without delay. Therefore, there is a possibility that the functional deterioration of that semiconductor chip itself cannot be sufficiently prevented. For example, although Japanese Unexamined Patent Application Publication No. 2011-170943 discloses a temperature sensor disposed in each memory, it does not disclose how the temperature sensor is handled when the logic side generates heat. Further, it is very difficult to predict a place(s) in a semiconductor chip where the temperature rises due to heat from a neighboring semiconductor chip in advance and appropriately dispose another temperature sensor(s) in that semiconductor chip itself.

Further, for example, when the semiconductor chip itself is a memory chip, its memory cells are controlled to cope with a high temperature. However, there is no need to control all the memory cells at all times. Frequent access to memory cells for which control is unnecessary causes another problem that the power consumption of the memory chip will increase. For example, in the refresh control of a DRAM, when all the memory cells in the memory chip are refreshed as shown in Japanese Unexamined Patent Application Publication No. 2013-101728, memory cells whose temperatures are not high are also unnecessarily refreshed, thus unnecessarily increasing the power consumption of the memory chip.

Other problems and novel features will be more apparent from the following descriptions in this specification and the accompanying drawings.

A first aspect of the present invention is a semiconductor device includes a first semiconductor chip and a second semiconductor chip coupled to the first semiconductor chip. The first semiconductor chip includes a memory circuit including a plurality of memory areas each of which includes memory cells. The second semiconductor chip includes: a plurality of temperature sensors disposed in mutually different places in the second semiconductor chip, each of the plurality of temperature sensors being configured to measure a temperature; and a memory controller that controls each of the plurality of memory areas of the memory circuit of the first semiconductor chip based on an output result output from a respective one of the plurality of temperature sensors.

According to this aspect, it is possible to prevent (or reduce) the functional deterioration of the memory circuit and reduce its power consumption at the same time.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

A semiconductor device according to an embodiment of the present invention is explained hereinafter. It should be noted that the semiconductor device in this specification means any of a semiconductor chip in which an electronic circuit for implementing desired functions is formed in an integrated manner, a semiconductor wafer in which a plurality of such semiconductor chips are formed before being cut into individual chips, and a device or the like in which one or a plurality of semiconductor chips are packaged by using a resin or the like.

First Embodiment

Figure 1:
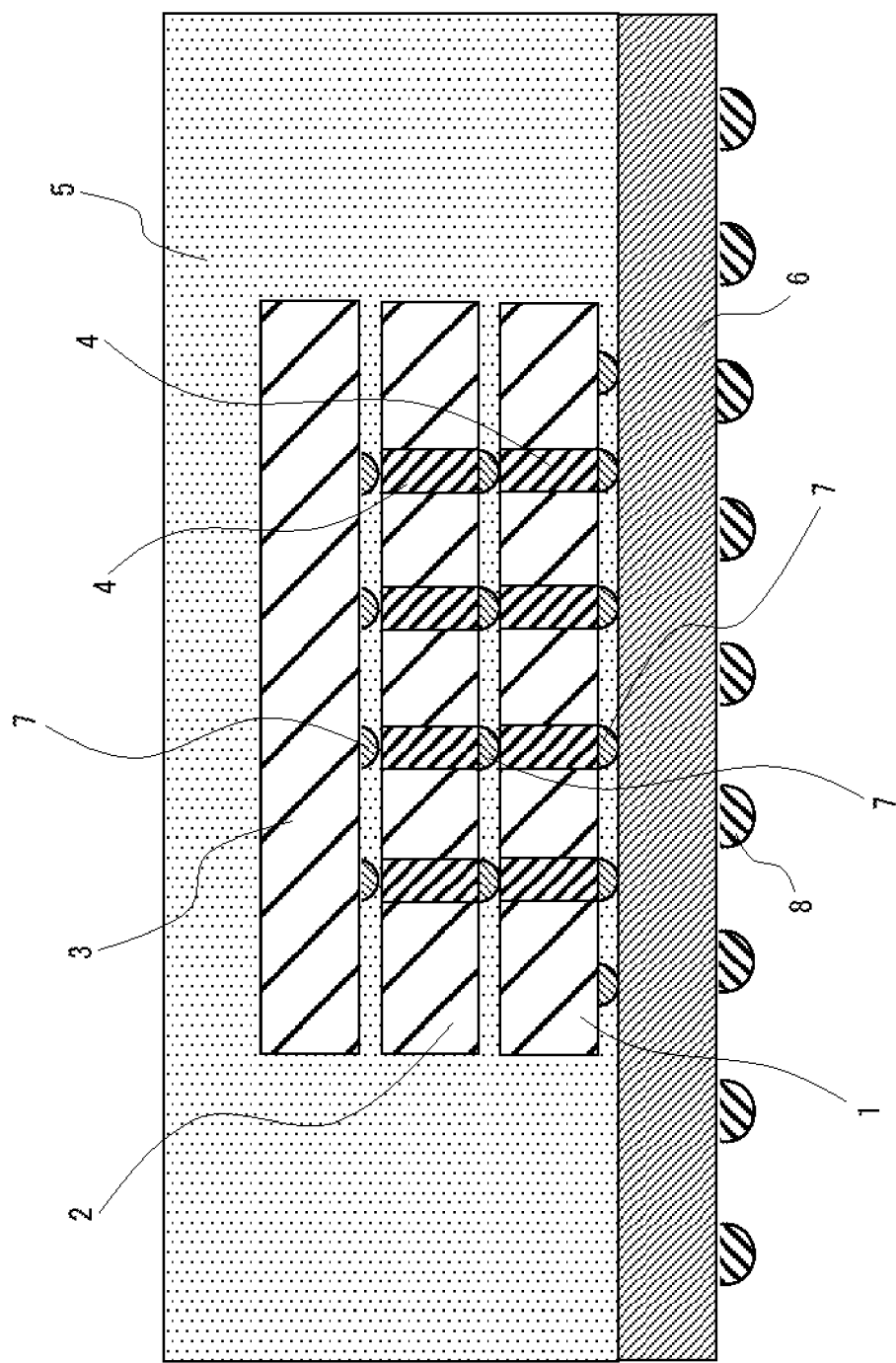
FIG. 1 is a cross section of a semiconductor device according to a first embodiment.

FIG. 1 shows an example of a cross section of a semiconductor device according to a first embodiment of the present invention. The semiconductor device includes semiconductor chips 1, 2 and 3 made of silicon and the like, an interposer substrate 6, solder balls 8, and a resin 5. The semiconductor chips 1, 2 and 3 are stacked on top of one another on the interposer substrate 6 (wiring substrate). The resin 5 hermetically encloses the semiconductor chips 1, 2 and 3. Each of the semiconductor chips 1 and 2 includes silicon through-vias (i.e., silicon through-contacts (hereinafter called "through-vias")) 4 and bump electrodes 7. The semiconductor chip 3 includes bump electrodes 7. The semiconductor chip 3 may also include silicon through-vias connected to the bump electrodes 7 as in the case of the semiconductor chip 2. However, no silicon through-via is provided in the semiconductor chip 3 in this example.

The semiconductor device 3 is electrically connected to the semiconductor device 2 through its bump electrodes 7 and also electrically connected to the semiconductor device 1 through metal of transistors, silicon through-vias 4, and bump electrodes 7 formed in the semiconductor device 2. The semiconductor device 2 is electrically connected to the semiconductor device 1 through its bump electrodes 7 and also electrically connected to the interposer substrate 6 through metal of transistors, silicon through-vias 4, and bump electrodes 7 formed in the semiconductor device 1. The interposer substrate 6 is mounted on a mother board or the like by the solder balls 8. The semiconductor device 1 is electrically connected to the interposer substrate 6 through its bump electrodes 7. Note that the interposer substrate 6 is a substrate made of a glass epoxy resin and includes a wiring pattern. Note that in FIG. 1, three semiconductor chips, i.e., the semiconductor chips 1, 2 and 3 are stacked on top of one another and silicon through-vias are provided in each of them. However, four or more semiconductor chips may be stacked on top or one another and silicon through-vias may be provided in each of them. In any of the above cases, the distance between neighboring semiconductor chips is about 50 μm. Note that, in general, the distance between wiring lines formed on a semiconductor chip is shorter than the distance between wiring lines formed on an interposer substrate.

Note that the semiconductor chip 1 is a chip on which a logic circuit is formed. For example, the semiconductor chip 1 is a logic chip on which a baseband processor or an application processor used for a mobile device or a communication device is provided. The logic chip is also called an "SoC (System on Chip)". Each of the semiconductor chips 2 and 3 is, for example, a memory chip in which a DRAM (Dynamic Random Access Memory) circuit is formed. Hereinafter, the semiconductor chip 1 is referred to as "logic chip 1" and the semiconductor chips 2 and 3 are referred to as "DRAM chips 2 and 3". Note that, in general, a memory (such as a DRAM) has a tradeoff relation between its storage capacity and its operating speed. In at least one of transistors forming a part of a storage element (memory cell), its gate length (process rule), for example, has such a tendency that when the former (i.e., operating speed) is more important than the latter (i.e., storage capacity), the gate length is increased, whereas when the latter is more important than the former, the gate length is decreased. Therefore, the gate length of at least one of transistors of a memory chip could be longer than, shorter than, or equal to the gate length of at least one of transistors forming a semiconductor element of a logic chip.

Figure 3:
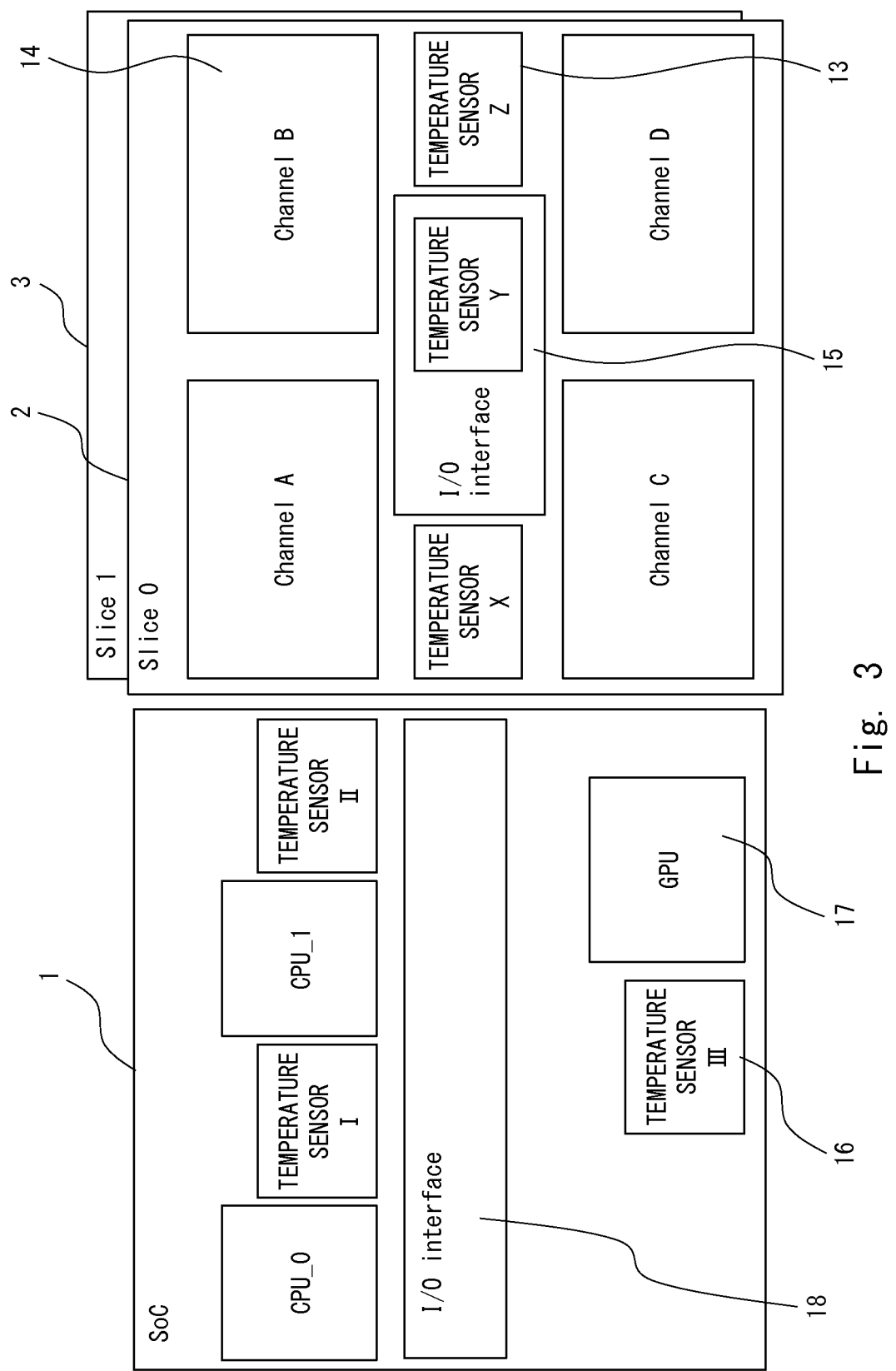
FIG. 3 is a block diagram showing an example of a temperature sensor arrangement of the semiconductor device according to the first embodiment.

FIG. 3 shows an example of an arrangement of temperature sensors in the logic chip 1 and the DRAM chip 2. The logic chip 1 includes a plurality of various logic circuits 17 such as a CPU (Central Processing Unit) and a GPU (Graphic Processing Unit), a plurality of temperature sensors 16 provided so as to correspond to the plurality of logic circuits, and an I/O (Input/Output) interface 18. The I/O interface 18 is disposed in the center of the chip. The I/O interface 18 serves as a physical connection section for connection with the chips disposed above and below the logic chip 1 and is also used for communication with those chips. The silicon through-vias shown in FIG. 1 are included in this I/O interface 18. Note that the I/O interface 18 does not necessarily have to be disposed in the center of the logic chip 1 and may be disposed in the end of the logic chip 1. However, by disposing the I/O interface 18 in the center of the logic chip 1, the logic chip 1 can be connected to the chips disposed above and below the logic chip 1 through the silicon through-vias, even when the sizes of those chips are small, more easily than in the case where the I/O interface 18 is disposed in the end of the I/O interface 18. The temperature sensors 16 detect the temperatures of the corresponding logic circuits. For example, a temperature sensor I, which is one of the temperature sensors 16, detects the temperature of the CPU_0. A temperature sensor II detects the temperature of the CPU_1. A temperature sensor III detects the temperature of the GPU. Note that one temperature sensor may detect the temperatures of two or more logic circuits. For example, when the CPU_0 and the CPU_1 are disposed more closely to each other, the temperature sensor I, which is disposed between them, may be used for both the CPU_0 and the CPU_1. As for the DRAM chips 2, each chip (each slice) includes a plurality of memory channels 14, an I/O interface 15, and a plurality of temperature sensors 13. In each of the DRAM chips 2 and 3, four memory channels 5 (Channels A to D), for example, are provided. As described later, each of the memory channels includes a memory cell array and various control circuits for controlling the memory cell array. The I/O interface 15 is disposed in the center of the chip. The I/O interface 15 serves as a physical connection section for connection with the chips disposed above and below that DRAM chip and is used for communication with those chips. The silicon through-vias shown in FIG. 1 are included in this I/O interface 15. The temperature sensors 13 are disposed inside or outside the I/O interface 15.

Figure 11:
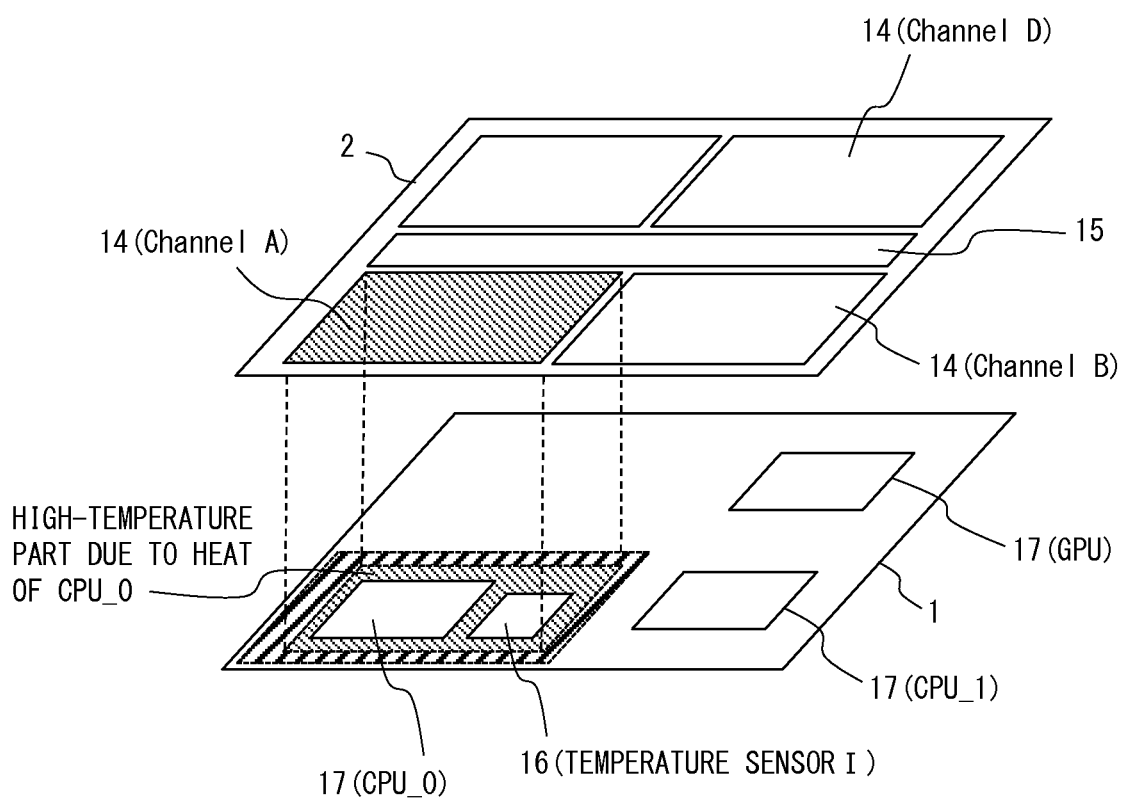
FIG. 11 is a block diagram showing an example of a temperature sensor arrangement of the semiconductor device according to the first embodiment.

FIG. 11 is a schematic diagram showing an example in which a temperature sensor of a logic chip is disposed in a place therein where a high-temperature part of a logic circuit and a memory channel of a DRAM chip overlap each other. The logic circuit, the temperature sensor, and the memory channel are the same as those shown in FIG. 3. In the DRAM chip 2, the memory channels 14 (Channels A to D) and the I/O interface 15 are disposed. In the logic chip 1, the CPU_0, the CPU_1, and the GPU are provided as logic circuits 17. Further, the heat caused by the operation of each of the logic circuits propagates to its peripheral area. The temperature sensor I (temperature sensor 16) is disposed in a place (high-temperature part) in the logic chip 1 where the temperature rises due to the heat generated by the CPU_0 and where a memory channel is located directly above or below that temperature sensor. In this way, the temperature sensor I (temperature sensor 16) is used to perform refresh control for the memory channel A. The temperature sensors II and III are also disposed in a manner similar to that of the above-described temperature sensor I, and used to perform refresh control for the memory channels B and D, respectively. Note that the refresh means an operation for retaining stored data. Specifically, it means an operation in which data is read from memory cells and the read data is written back into the same memory cells again. In a dynamic-type memory cell, an electric charge accumulated in the capacitor, which stores data, decreases over time due to heat or a leak current. Therefore, it is necessary to perform a refresh operation in which data is read and written again at regular intervals. The refresh cycle means these regular intervals.

Further, a temperature sensor may be disposed in an area where the high-temperature parts of the CPU_0 and the CPU_1 overlap each other. In that case, the memory channel A and the memory channel B are located directly above or below the temperature sensor. The association between each temperature sensor of the logic chip and each memory channel of the DRAM chip, including the above-described case, is made by switches 44 (FIG. 6) (which are described later).

Figure 5:
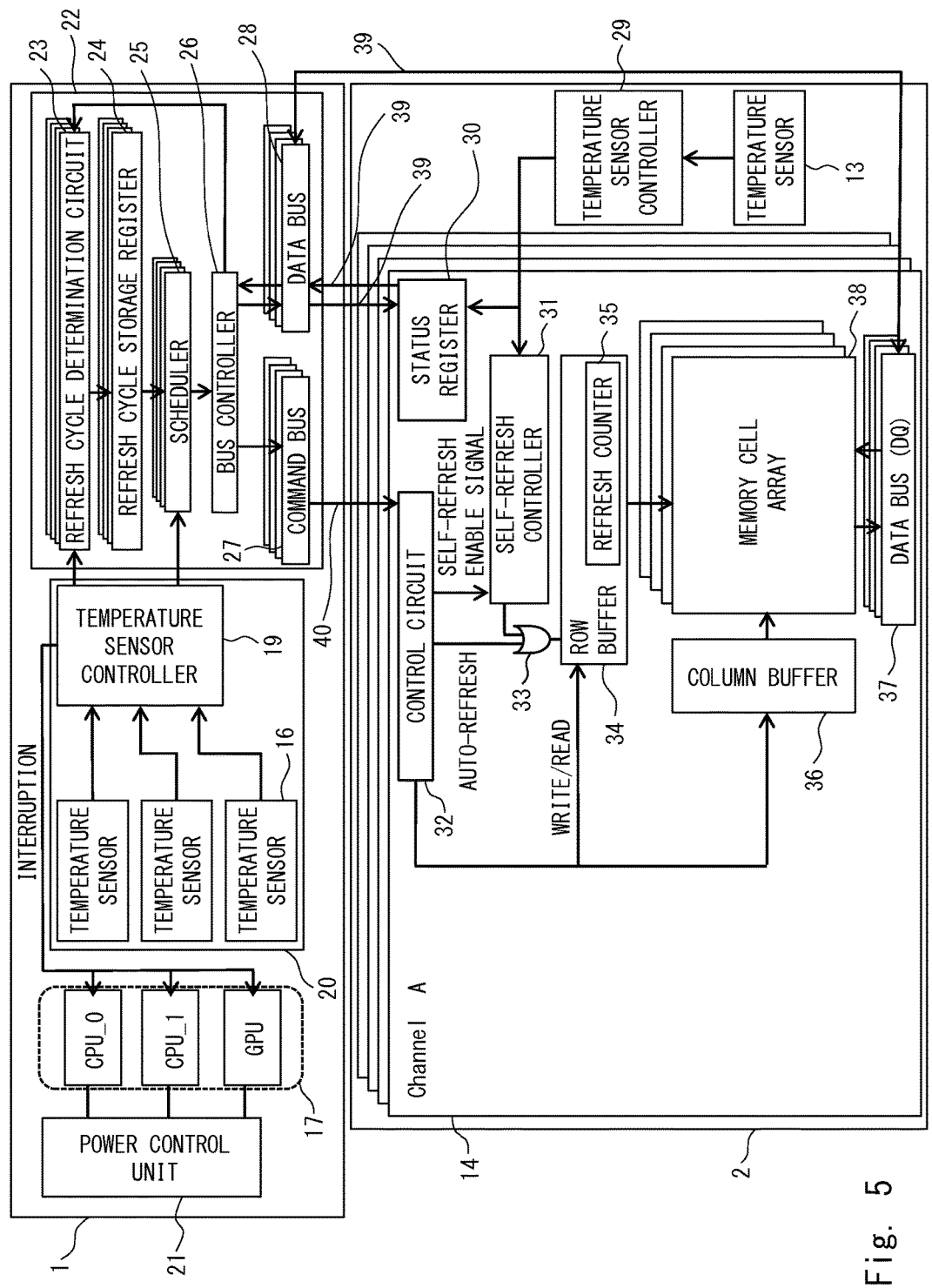
FIG. 5 is a block diagram showing an example of a circuit configuration of the semiconductor device according to the first embodiment.

FIG. 5 is a circuit configuration diagram showing the configuration of the logic chip 1 and the DRAM chip 2 in a more detailed manner. The logic chip 1 includes a plurality of logic circuits 17 (e.g., CPU_0, CPU_1 and GPU), a temperature management system 20 for these logic circuits, a memory controller 22, and a power control unit 21. The temperature management system 20 includes, as explained above, a plurality of temperature sensors 16 disposed so as to correspond to respective logic circuits, and a temperature sensor controller 19 that processes output values from the temperature sensors 16. The power control unit 21 controls the power consumption of each of the logic circuits by changing the mode of that logic circuit to a power-down mode or using a similar method. The memory controller 22 receives information from the CPU (CPU_0 or CPU_1) and controls its access to the DRAM chip 2. The memory controller 22 includes refresh cycle determination circuits 23, refresh cycle storage registers 24, schedulers 25, a bus controller 26, command buses 27, and data buses 28. A set of the refresh cycle determination circuit, the refresh cycle storage register, the scheduler, the command bus, and the data bus is provided for and corresponds to a respective one of the memory channels A, B, C and D.

The DRAM chip 2 includes memory channels 14, a temperature sensor 13, and a temperature sensor controller 29. Each of the memory channels 14 includes memory cell arrays 38 each including memory cells, a row decoder (not shown), a column decoder (not shown), a sense amplifier (not shown), a row buffer 34, a column buffer 36, a data bus 37, a status register 30, a self-refresh controller 31, a control circuit 32, and a logic gate 33. The row buffer includes a refresh counter 35. Data writing to or data reading from memory cells is performed as follows: a write or read command is issued from the memory controller 22; and a low address is specified through the control circuit 32. Note that the refresh counter 35 may be disposed outside the row buffer 34. There are four memory channels, i.e., the memory channels A, B, C and D. In the figure, the memory channel A is shown as a representative memory channel and represented by a reference number 14. Each of the memory channels B, C and D has a configuration similar to that of the memory channel A. Further, the temperature sensor 13 is a temperature sensor selected from the temperature sensors X to Z shown in FIG. 3 and shown as a representative temperature sensor in FIG. 6.

In FIG. 5, the refresh cycle determination circuit 23 determines a refresh cycle for the memory channel based on temperature information received from the temperature sensor controller 19 and temperature information received from the DRAM chip 2. The refresh cycle is determined in such a manner that the higher the temperature indicated by the temperature information is, the shorter the refresh cycle becomes. Details of the refresh cycle changing flow are described later. When a new refresh cycle is determined, the determined refresh cycle is stored in the refresh cycle storage register 24 and sent to the scheduler 25. When the refresh cycle is determined, the scheduler 25 controls a timing at which a refresh command is sent to the DRAM chip according to the determined refresh cycle. The refresh command is sent to the DRAM chip through the bus controller and the command bus. Note that the command bus 27 is connected to terminals of the DRAM chip, such as RAS (Row Address Strobe), CAS (Column Address Strobe), WE (Write Enable), CK (Clock), CKE (Clock Enable), CS (Chip Select), and Add (Address Input). Further, the data bus 28 is connected to other terminals of the DRAM chip, such as DQ (Data Input/Output), DQS (Data Strobe), and DM (Input Data Mask). The specifications of these terminals of the DRAM chip are specified under JEDEC standards of Wide I/O. With the above-described configuration, when a temperature sensor of the logic chip detects a high temperature, the refresh operation of a corresponding memory channel can be controlled, thus making it possible to sufficiently prevent the functional deterioration of the DRAM chip and reduce the power consumption of the DRAM chip. Further, by providing temperature sensors in the DRAM chip as well as in the logic chip, it is possible to perform refresh control based on the temperature of the DRAM chip, thus making it possible to prevent the functional deterioration of the DRAM chip even further and reduce the power consumption of the DRAM chip even further.

Figure 6:
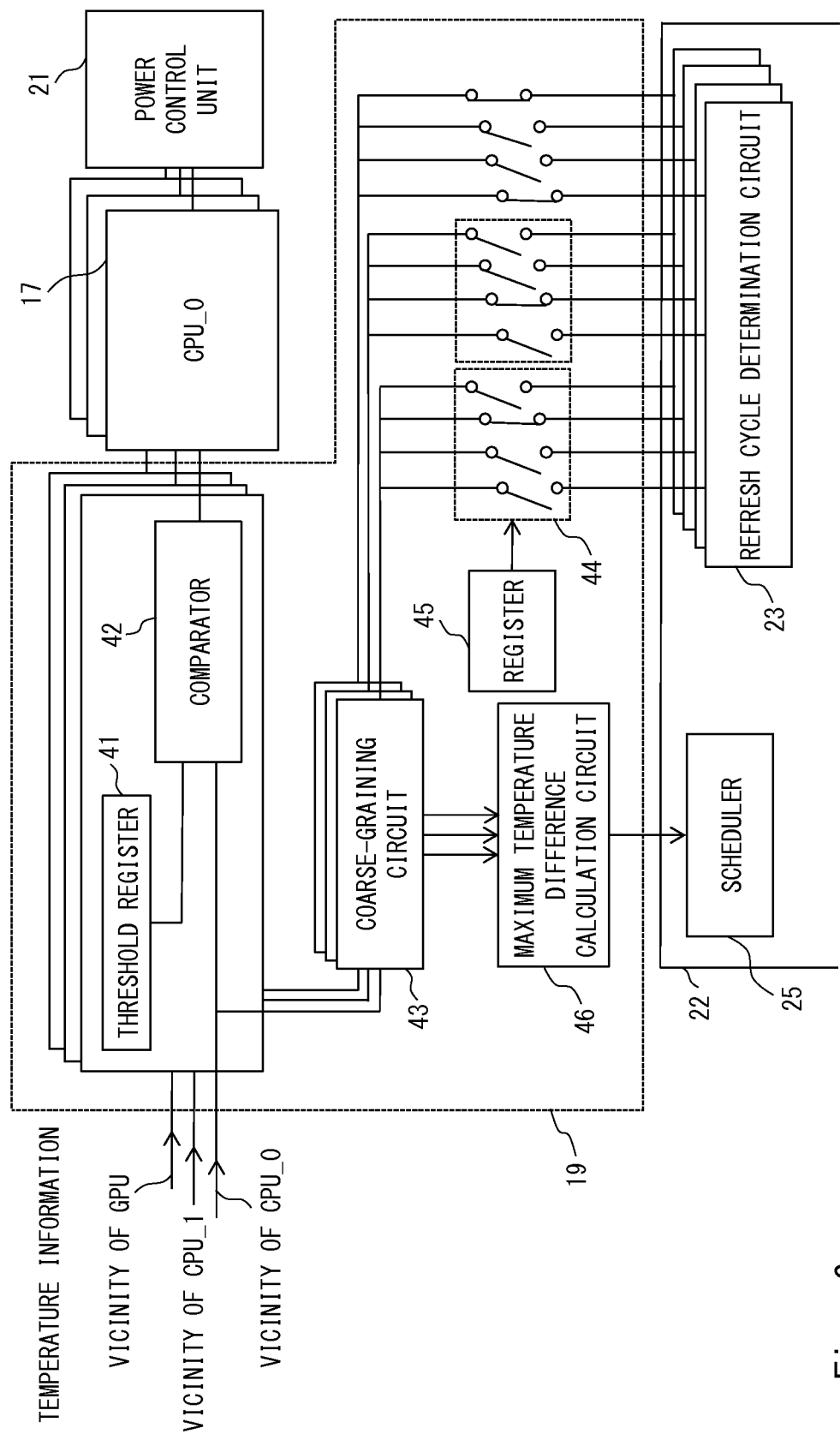
FIG. 6 is a block diagram showing an example of a temperature sensor controller of the semiconductor device according to the first embodiment.

FIG. 6 is a circuit configuration diagram showing an example of an internal configuration of the temperature sensor controller 19. The temperature sensor controller 19 includes threshold registers 41 that hold temperature thresholds, comparators 42 that compare values in the threshold register with input temperature information, circuits 43 that coarsely-visualize (convert) the temperature information, switches 44, a register 45 that stores control information for the switches, and a maximum temperature difference calculation circuit 46. There are a plurality of sets each of which consists of the threshold register 41, the comparator 42, and the coarse-graining circuit 43. Further, each of these sets corresponds to a respective one of the CPU_0, the CPU_1, and the GPU.

Each of the temperature sensors 16 of the logic chip 1 measures the temperature (analog value) of the area where that temperature sensor is disposed, converts the measured analog temperature value into a digital value, and outputs the digital value to the temperature sensor controller 19 as temperature information. The temperature sensor controller 19 narrows down the input temperature information into a signal having the minimum number of bits necessary for the refresh cycle determination and the maximum temperature difference calculation by using the coarse-graining circuit 43, and then outputs the obtained signal having the minimum number of bits to the memory controller 22. The coarse-graining circuit 43 is provided to simplify the hardware and is not an indispensable component. Note that a status register of the DRAM chip (which is described later) also includes a coarse-graining circuit for simplifying temperature information.

The (coarse-visualized) temperature information of each of the logic circuits is associated with a respective one of the refresh cycle determination circuits 23 by the switches 44. Similarly to the example shown in FIG. 11, since the temperature sensor I needs to be associated with the memory channel A, the switches select a refresh cycle determination circuit corresponding to the memory channel A. The register 45 holds a value for specifying one or more than one memory channel that should be associated with one temperature sensor. Therefore, for temperature information from one temperature sensor, it is possible to arbitrarily select a refresh cycle determination circuit corresponding to a necessary memory channel (s) from among the four refresh cycle determination circuits corresponding to the memory channels A, B, C and D. In this way, temperature sensors of the logic chip can be associated with memory channels of the DRAM chip in a one-to-many fashion. Therefore, even when the places of memory channels in the DRAM chips differ from one DRAM chip to another, temperature sensors of the logic chip can be disposed in places therein corresponding to those memory channels. The register 45 can be, for example, accessed from the CPU_0 and holds a value with which the CPU_0 specifies a memory channel(s) in the initialization process. Note that the switches do not necessarily have to be controlled by the register. That is, the switches may be controlled by fuses.

The temperature sensor I corresponding to the logic circuit CPU_0 has been explained so far. The control of each of the temperature sensors II and III corresponding to the CPU_1 and the GPU, respectively, based on temperature information is also performed in a manner similar to that for the CPU_0. The switches are turned on or off so that the temperature sensors II and III correspond to the memory channels B and D, respectively. Further, when it is determined in advance as to which memory channels the temperature sensors should be associated with, the switches are unnecessary. That is, the temperature sensor controller 19 may be configured so that temperature information of each temperature sensor is supplied to a refresh cycle determination circuit for its corresponding memory channel without using switches.

The temperature sensor controller 19 can change the mode of each of the logic circuits to a power-down mode based on temperature information of that logic circuit.

As a representative example, the control of the temperature sensor I corresponding to the logic circuit CPU_0 based on temperature information is explained hereinafter. The temperature information held in the threshold register 41 indicates, for example, a value that is high enough to have a harmful effect on the operation of the logic circuit (e.g., 105° C. or higher). The comparator 42 compares the temperature information received from the temperature sensor I with temperature information held in the threshold register and supplies the comparison result to an interrupt controller (not shown). When the temperature information supplied from the temperature sensor I is higher than the temperature information held in the threshold register, the interrupt controller outputs an interrupt signal to the logic circuit CPU_0 located near the temperature sensor I. Upon receiving the interrupt signal, the logic circuit CPU_0 accesses the power control unit 21 and the power control unit 21 changes the mode of the logic circuit CPU_0 to a low-power consumption mode. Note that the interrupt controller may directly access the power control unit, rather than accessing it through the CPU_0. Examples of the low-power consumption mode include clock control and power cut-off. In the clock control, the clock frequency of each logic circuit is adjusted to a lower value or zero by the power control unit and clock control means (including an oscillator). A register(s) may be used for selecting a frequency and/or a logic circuit. Further, in the power cut-off, each logic circuit may be successively powered off or all the logic circuits may be simultaneously powered off under an instruction from the power control unit. The temperature management system can prevent the logic circuit from having a high temperature and thereby prevent it from malfunctioning.

Figure 7:
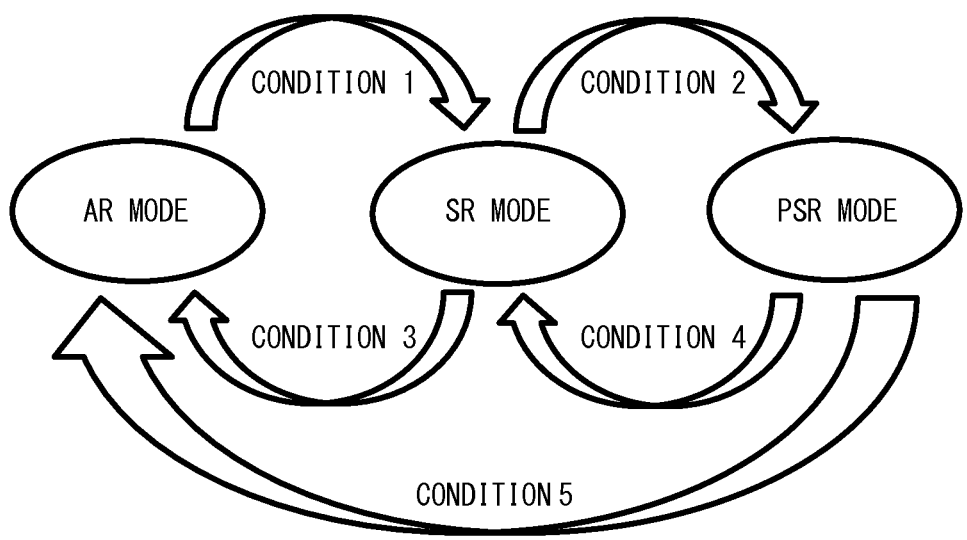
FIG. 7 is an explanatory diagram showing a transition relation among refresh modes of the semiconductor device according to the first embodiment.

FIG. 7 shows various refresh modes for the DRAM chip and a transition relation among them. Note that the "CPU" means the CPU_0 or the CPU_1 in the following explanations. As refresh modes of the DRAM chip, there are an auto-refresh mode (hereinafter called "AR mode"), a self-refresh mode (hereinafter called "SR mode"), and a pseudo-refresh mode (hereinafter called "PSR mode"). In the AR mode, the DRAM chip receives an instruction directly from the CPU, and thereby performs a refresh operation while monitoring the temperatures of the logic circuit and the DRAM chip. In the SR mode, the DRAM chip voluntarily performs a refresh operation while monitoring the value of its own temperature sensor 13. In the PSR mode, the DRAM chip does not receive an instruction directly from the CPU, but does perform a refresh operation while monitoring the temperatures of the logic circuit and the DRAM chip. Note that the power consumption of the DRAM chip is minimized when the DRAM chip in the SR mode among the above-described three modes.

Further, in the AR mode and the PSR mode, a refresh operation can be performed for each memory channel and a refresh cycle can be defined for each memory channel. In the SR mode, although a refresh operation can be performed for each channel, a refresh cycle can be defined only for each DRAM chip. Further, in the AR mode, data can be read from or written to a memory channel while a refresh operation is being performed for that memory channel. In contrast to this, data cannot be read from or written to a memory channel while a refresh operation is being performed for that memory channel in the SR mode and the PSR mode.

The conditions for transitions among the three modes are as follows:

Condition 1: AR mode -> SR mode: arbitrarily performed according to an instruction of the CPU;

Condition 2: SR mode -> PSR mode: performed according to a flowchart shown in FIG. 8 (which is described later);

Condition 3: SR mode -> AR mode: arbitrarily performed according to an instruction of the CPU;

Condition 4: PSR mode -> SR mode: performed according to a flowchart shown in FIG. 9 (which is described later); and Condition 5: PSR mode -> AR mode: arbitrarily performed according to an instruction of the CPU.

Although the mode can be changed from the AR mode to the PSR mode through the SR mode, it cannot be directly changed from the AR mode to the PSR mode. Further, the mode is changed under the Condition 1 when the CPU needs to bring the DRAM chip into a low-power consumption state. The mode is changed under the Condition 3 or 5 when the CPU needs to read or write information from or to the memory channel.

Each of the refresh modes is explained hereinafter in detail.

(a) SR Mode

The SR mode is set as an initial mode of the DRAM chip by the CPU (e.g., CPU_0). When the SR mode is set, a self-refresh enable signal is output from the control circuit 32 to the self-refresh controller 31. Then, the temperature sensor 13 reads the temperature of the DRAM chip and the temperature sensor controller 29 determines a refresh cycle based on that temperature. Note that this refresh cycle is also changed according to a value in an offset register (which is described later). The self-refresh controller 31 outputs a refresh command to the refresh counter 35 disposed in the row buffer 34 through the logic gate 33 based on the determined refresh cycle. The refresh counter 35 increments its own value every time the refresh counter 35 receives the refresh command. In this way, a refresh operation is performed for memory cells corresponding to the same row address. The function of the logic gate is described later.

Note that the information of the refresh cycle determined by the temperature sensor controller 29 is also sent to the status register 30 and held in the status register 30.

Figure 8:
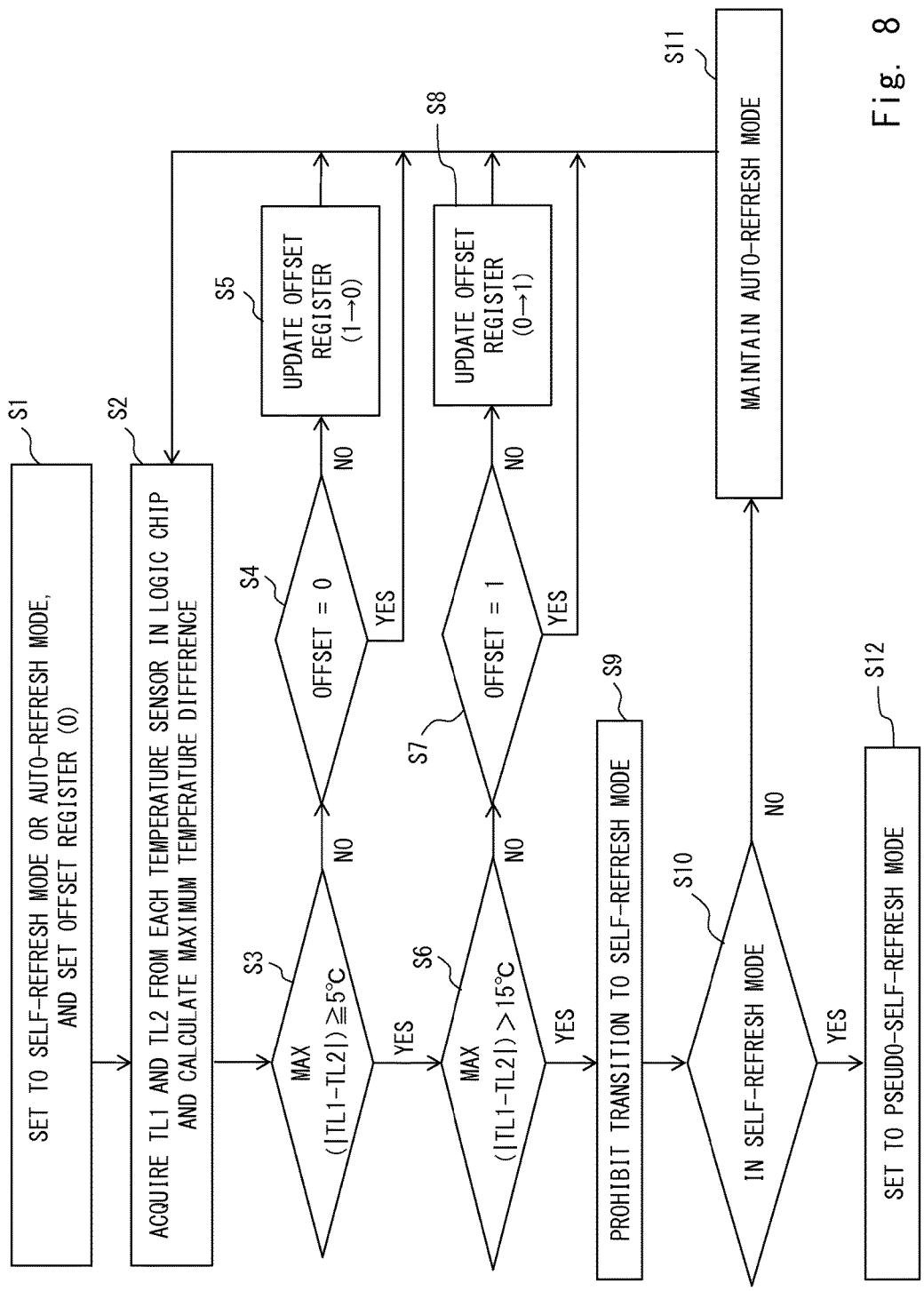
FIG. 8 is a flowchart for refresh mode transitions of the semiconductor device according to the first embodiment.

FIG. 8 shows a flowchart showing a transition from an SR mode to a PSR mode. In a step S1, when an SR mode is set, the scheduler 25 disposed in the memory controller 22 sets an offset register disposed in the status register 30 to zero. The offset register is described later.

In a step S2, a temperature is also detected by each temperature sensor 16 disposed in the logic chip 1 in the SR mode. Further, a maximum temperature difference between a plurality of detected temperatures is calculated by the maximum temperature difference calculation circuit 46 disposed in the temperature sensor controller 19. Details of the maximum temperature difference calculation circuit 46 are described later.

In steps S3, S4 and S5, when the maximum temperature difference calculated in the step S2 is smaller than 5° C., the offset register is maintained as it is when the offset register has been set to zero and is updated to zero when it has been set to one. Then, the process returns to the step S2.

In steps S6, S7 and S8, when the maximum temperature difference calculated in the step S2 is no smaller than 5° C. and no larger than 15° C., the offset register is maintained as it is when the offset register has been set to one and is updated to one when it has been set to zero. Then, the process returns to the step S2.

In a step S9, when the maximum temperature difference calculated in the step S2 is larger than 15° C., the transition to the SR mode is prohibited.

In a step S10, when the mode is the SR mode, the mode is changed to the PSR mode. On the other hand, when the mode is not the SR mode (is the AR mode), the AR mode is maintained. Then the process returns to the step S2.

When the offset register is updated from zero to one, the refresh cycle set by the temperature sensor controller 29 is corrected (i.e., changed). For example, when the refresh cycle set by the temperature sensor controller 29 is 70 μs and the temperature difference in the logic chip is no smaller than 5° C. and no larger than 15° C., the refresh cycle is changed to 80 μs after the offset register is updated. By the updating of the offset register, the DRAM chip can obtain temperature information of the logic chip even in the SR mode. Therefore, by correcting (i.e., changing) the refresh cycle set by the temperature sensor controller 29 according to the value in the offset register, a refresh operation can be performed in a more optimal refresh cycle. Note that the scheduler includes an internal copy register in which the value of the offset register is copied in order to check the state of the offset register. Therefore, whenever the offset register of the DRAM chip is updated, the copy register is also updated.

(2) AR Mode

Figure 2:
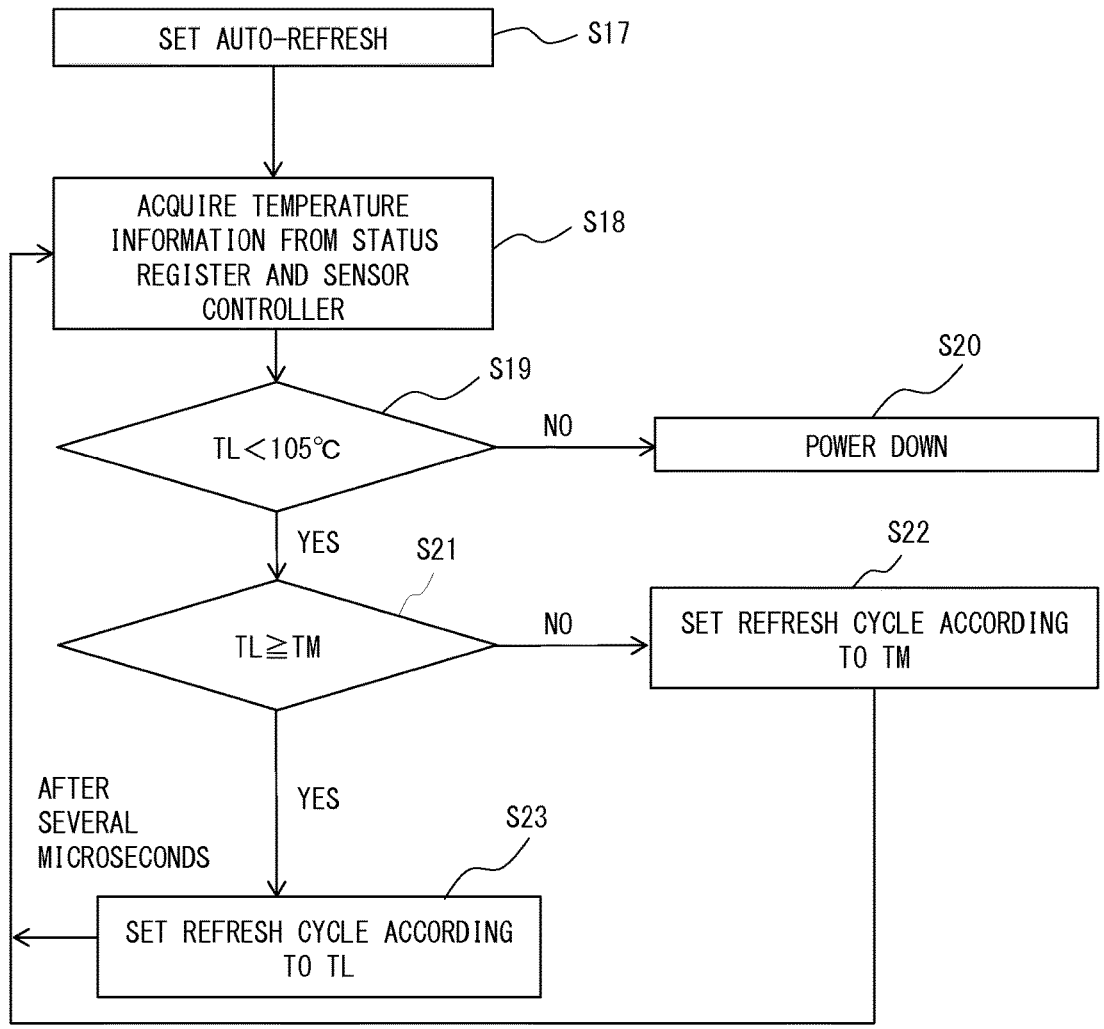
FIG. 2 is a flow chart for an AR mode of the semiconductor device according to the first embodiment.

The AR mode is set as an initial mode of the DRAM chip by the CPU (e.g., CPU_0). FIG. 2 shows a flowchart for determining a refresh cycle when an AR mode is set.

In steps S17 and S18, when an AR mode is set, the temperature sensor controller 29 stores temperature information TM of the DRAM chip read by the temperature sensor 13 into the status register 30 on the DRAM chip side. Meanwhile, on the logic chip side, temperature information TL of the logic chip read by the temperature sensor 16 is sent to the temperature sensor controller 19 as described above.

In steps S19 and S20, when the temperature information TL is equal to or higher than 105° C., the logic chip is set to the above-described power-down mode. Note that at this point, the memory channel corresponding to the place of the high-temperature logic circuit can be power-downed by, for example, turning off the clock enable signal output from the command bus. By power-downing only the corresponding memory channel, it is possible to prevent the performance of the DRAM chip from significantly deteriorating compared to the case where all the memory channels are power-downed.

In steps S21, S22 and S23, the temperature information TM stored in the status register 30 and the temperature information TL (lower than 105° C.) obtained by the temperature sensor controller 19 are sent to the refresh cycle determination circuit 23. In the refresh cycle determination circuit, the value from the temperature information TL is compared with that of the temperature information TM. Then, when the temperature information TL is equal to or higher than the temperature information TM (TL≥TM), a refresh cycle is set based on the value from the temperature information TL. When the temperature information TL is lower than the temperature information TM (TL<TM), a refresh cycle is determined based on the value from the temperature information TM. For either of the temperature information TL and TM, the higher the temperature is, the smaller value the refresh cycle is set to. For example, when the temperature is 80° C., the refresh cycle is set to 10 μs. Further, when the temperature is 90° C., the refresh cycle is set to 5 μs. Several microseconds after the setting of the refresh cycle, the process returns to the step S18. Note that the transmission of the temperature information from the status register 30 to the refresh cycle determination circuit 23 is performed through any of the DQ, DQS, and DQM terminals of the DRAM chip.

The determined refresh cycle is stored in the refresh cycle storage register and sent to the scheduler. When the refresh cycle is determined, the scheduler controls a timing at which a refresh operation is performed according to the determined refresh cycle and sends a refresh command to the command bus through the bus controller. The refresh command is sent from the command bus to the control circuit disposed in the DRAM chip, and then sent to the refresh counter 35 disposed in the row buffer 34 through the logic gate 33. The subsequent process flow leading to a refresh operation is similar to that for the above-described SR mode. In FIG. 5, the logic gate 33 is an exclusive-OR gate. However, the logic gate 33 is not limited to the exclusive-OR gate and may be any control means capable of preventing the SR mode and the AR mode from being simultaneously performed.

Note that even in the AR mode, the flowchart shown in FIG. 8 is performed. The only difference from the case where the SR mode is initially set is the step S11. That is, when the maximum temperature difference is larger than 15° C., the AR mode is maintained rather than changing to the PSR mode.

(3) PSR Mode

As described above, the PSR mode is set when the maximum temperature difference in the logic chip triggers a mode change when the DRAM chip is in the SR mode. The change of the refresh cycle in the PSR mode is similar to that in the AR mode (FIG. 2).

Figure 9:
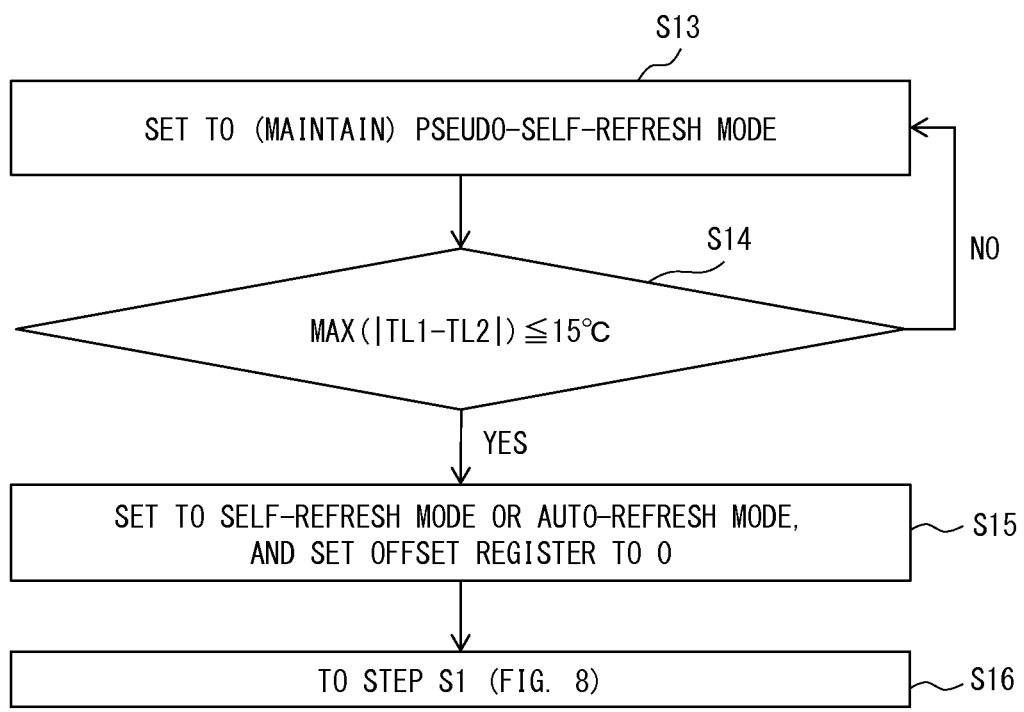
FIG. 9 is a flowchart for a transition from a PSR mode to an SR mode of the semiconductor device according to the first embodiment.

FIG. 9 is a flowchart for changing the mode, after changing from an SR mode to a PSR mode, to the SR mode again. As shown in steps S13, S14 and S15, even when the mode is set to the PSR mode, the maximum temperature difference calculation in the logic chip is continuously performed. Then, when the maximum temperature difference becomes equal to or smaller than 15° C., the mode is returned to the SR mode and, at the same time, zero is set to the above-described offset register. After the mode is returned to the SR mode, the process is performed again from the step S1 in FIG. 8. When the temperature difference becomes smaller, the power consumption of the DRAM chip can be further reduced by returning the mode to the SR mode.

Figure 10:
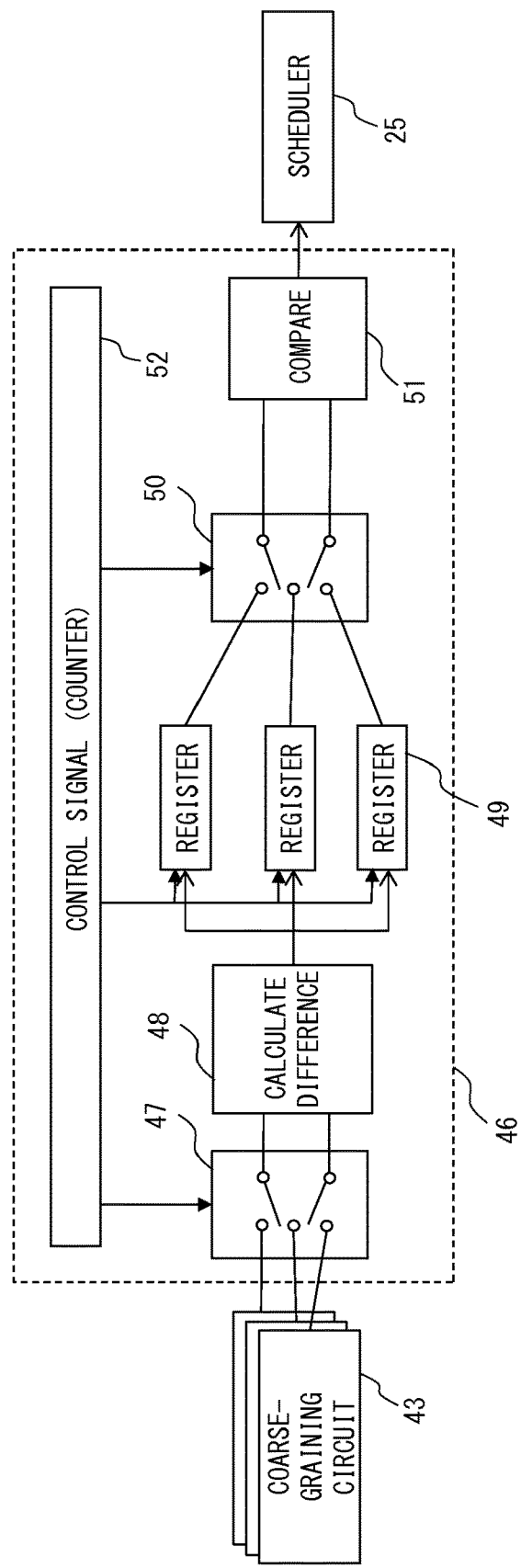
FIG. 10 is a block diagram showing an example of a configuration of a maximum temperature difference calculation circuit of the semiconductor device according to the first embodiment.

FIG. 10 shows a configuration of the maximum temperature difference calculation circuit 46 disposed in the temperature sensor controller 19. When all of the coarse-visualized temperature information pieces are supplied, two of them are selected by a switch 47 and a temperature difference between these two temperatures is calculated by a difference calculation circuit 48. The calculated difference information is stored in a register 47. In this way, all the possible combinations among the input temperature information pieces are selected, and differences between them are obtained and stored in respective registers. Two of the difference information pieces stored in the respective registers are selected by a switch 50, and the selected differences are compared with each other by a comparison circuit 51. In this way, information of the maximum difference is sent to the scheduler 25. The control of the switches 47 and 50 and the control of the registers into which difference data are stored are performed by using a control signal (counter) 52. Note that although three registers 49 are shown in FIG. 10, the number of registers changes according to the number of temperature sensors as a matter of course.

The above-described configuration is similarly applied to each of the memory channels B, C and D.

The present invention relates to a semiconductor device in which a plurality of semiconductor chips are coupled to one another. When a plurality of chips are stacked on top of one another, in particular, the present invention is superior not only in the countermeasure against the heat but also in the reduction in the size of the semiconductor device. Therefore, the present invention may be often used for mobile electronic devices/systems such as smartphones, tablet computers, and other various wearable devices.

The following are representative features of the above-described embodiment.

One aspect of the above-described embodiment relates to a semiconductor device including: a first semiconductor chip (memory chip) in which a memory circuit (DRAM circuit) including a plurality of memory areas (a plurality of memory channels) each of which includes memory cells are provided; and a second semiconductor chip (logic chip) in which a plurality of temperature sensors each of which measures a temperature are provided in mutually different places. The second semiconductor chip includes a memory controller that controls each of the plurality of memory areas based on an output result output from a respective one of the plurality of temperature sensors. In this way, the control of the memory areas is performed based on the measurement result of the corresponding temperature sensors, thus making it possible to reduce (or prevent) the functional deterioration of the memory circuit due to a high temperature.

According to another aspect, a semiconductor device (semiconductor chip) connected to another semiconductor chip in which a memory circuit (DRAM circuit) is formed includes a temperature sensor that measures a temperature, and a controller that controls a memory area (memory channel) located in the memory circuit based on an output result of the temperature sensor and temperature information received from the memory circuit. Since the control of the memory area is performed based not only on the temperature information of the semiconductor device itself but also on the temperature information of the semiconductor chip in which the memory circuit is disposed, the control of the memory area is performed more appropriately, thus making it possible to reduce (or prevent) the functional deterioration of the memory circuit due to a high temperature.

According to another aspect, a semiconductor device (e.g., a logic chip) including a logic circuit (CPU) that performs a desired operation includes: a temperature sensor that measures a temperature; a power controller that controls the power consumption of the logic circuit based on an output result from the temperature sensor; and a memory controller that controls a memory area (memory channel) of a memory circuit based on the output result output from the temperature sensor. In this way, by using the temperature sensor that measures the temperature in order to reduce the power consumption by power-downing the semiconductor chip when the semiconductor chip itself has a high temperature, the memory area of the memory circuit can be appropriately controlled.

Second Embodiment

Figure 4:
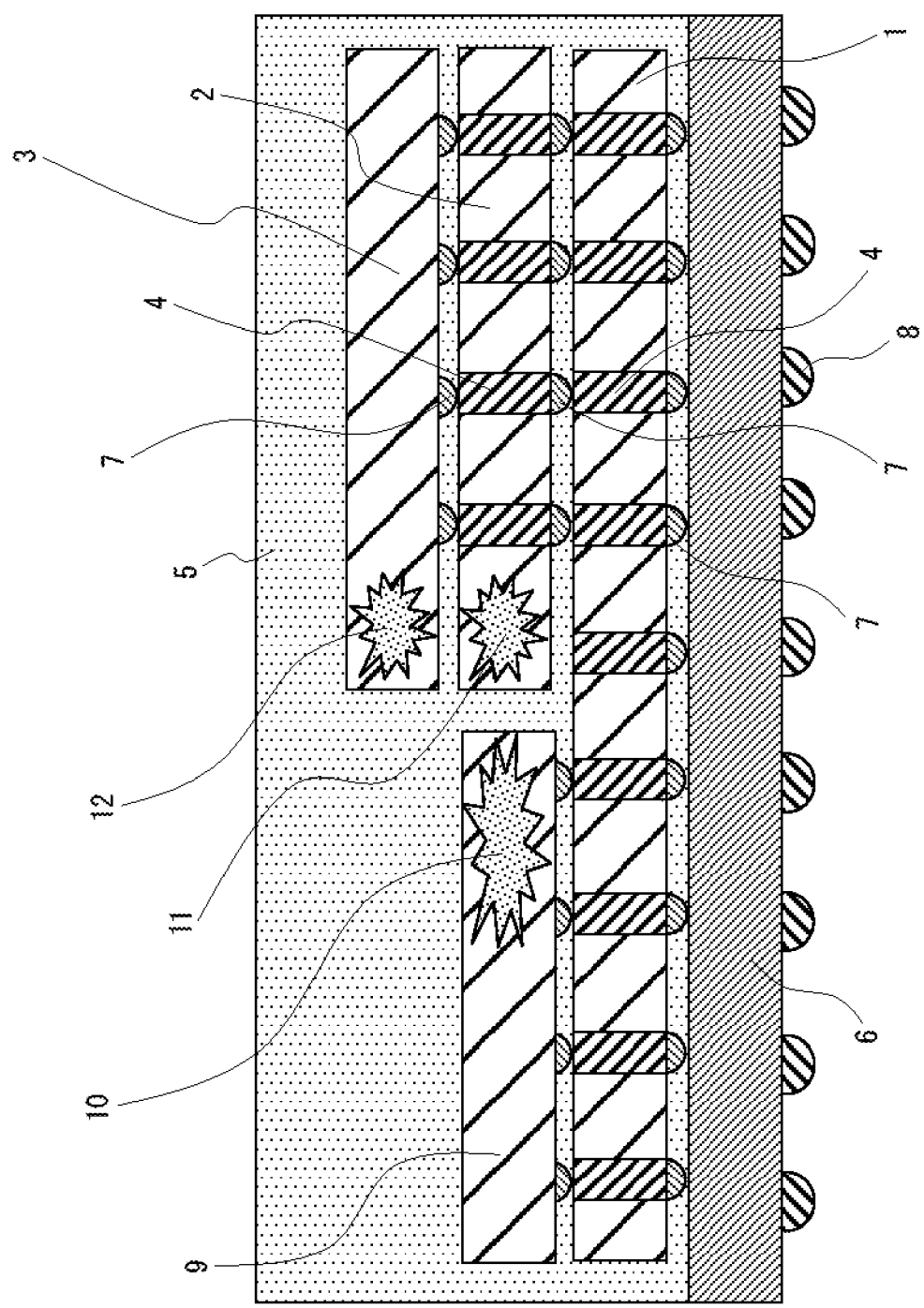
FIG. 4 is a cross section of a semiconductor device according to a second embodiment.

FIG. 4 shows an example of a cross section of a semiconductor device according to a second embodiment of the present invention. The semiconductor device further includes a semiconductor chip 9. The semiconductor chip 9 is formed of a silicon substrate and electrically connected to the semiconductor chip 1 through its own bump electrodes. Note that the semiconductor chip 9 is a logic chip similar to the semiconductor chip 1, and the semiconductor chip 9 is referred to as "logic chip 9" hereinafter. Note that in FIG. 4, silicon through-vias are provided only in the semiconductor chips 1 and 2. However, silicon through-vias may be provided in three or more semiconductor chips. In either case, the distance between the semiconductor chips 1 and 2 is about 50 µm and the distance between the semiconductor chips 2 and 9 is about 50 µm to 1 mm. The other features are similar to those of the semiconductor device shown in FIG. 1.

Figure 12:
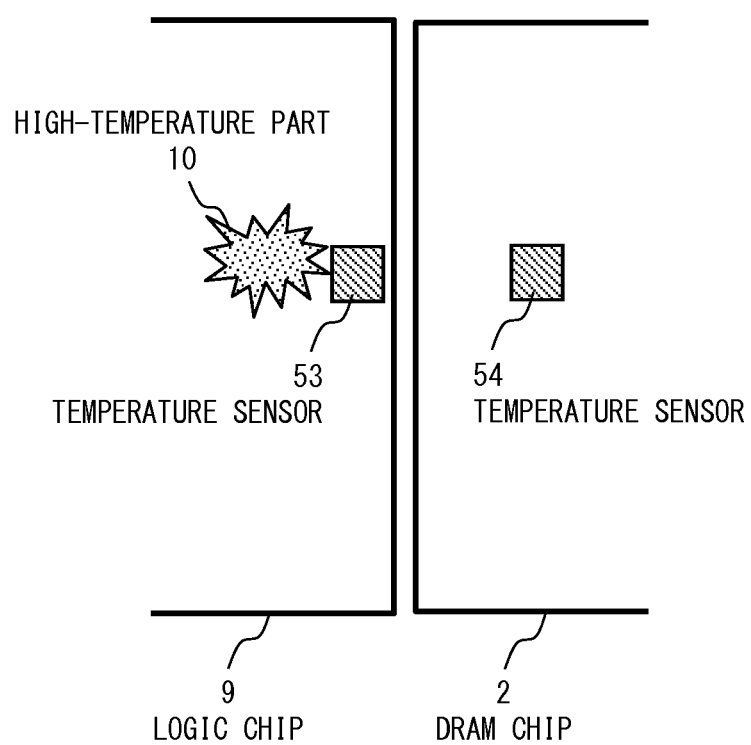
FIG. 12 is a diagram showing an example of a temperature sensor arrangement of a semiconductor device according to the second embodiment.

FIG. 12 shows an example of an arrangement of temperature sensors in the logic chip 9 and the DRAM chip 2 located adjacent to each other. The logic chip 9 and the DRAM chip 2 are disposed so that they do not overlap each other in planar view. The configuration of the logic chip 9 is similar to that of the logic chip 1 shown in FIGS. 3 and 5. Further, the configuration of the DRAM chip 2 is similar to that shown in FIGS. 3 and 5. A temperature sensor 53 is disposed near a high temperature part 10, which has a high temperature due to heat generated by the logic chip 9, and a temperature sensor 54 is disposed in the DRAM chip. In such a case, the distance between the high temperature part 10 and the memory channel of the DRAM chip 2 is longer than that in the case shown in the first embodiment where the logic chip and the DRAM chip are stacked on top of one another.

Figure 13:
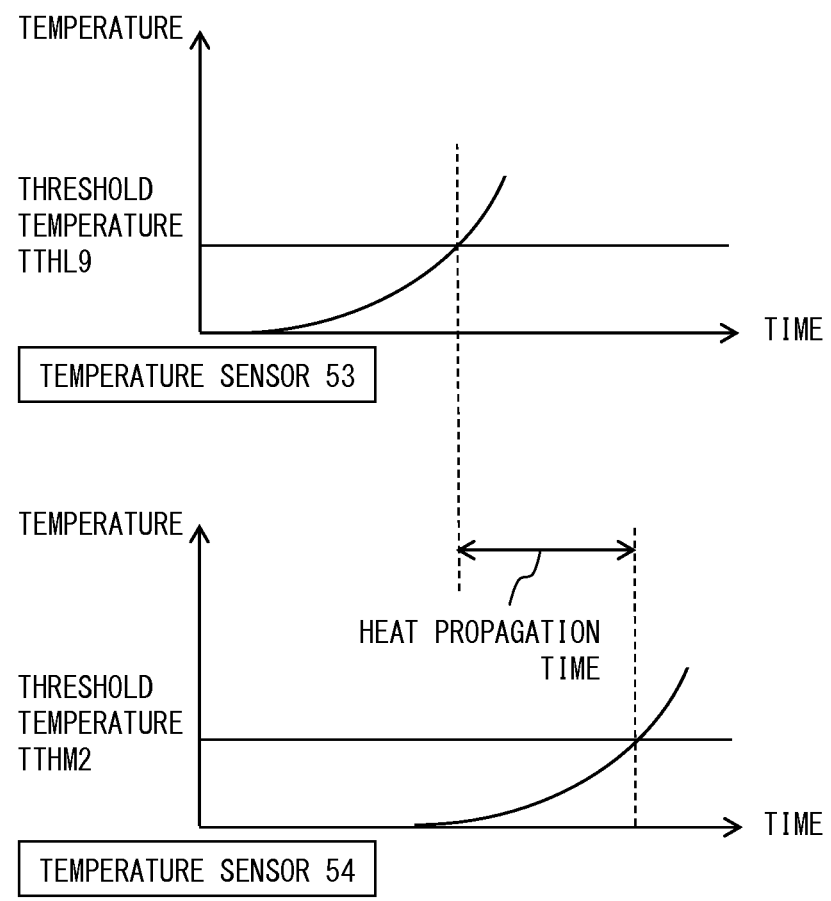
FIG. 13 is a graph showing temperature changes in the semiconductor device according to the second embodiment.

FIG. 13 shows how the temperature rises in the case of the temperature sensor arrangement shown in FIG. 12. The heat generated by the logic chip increases over time and is first detected by the temperature sensor 53. Further, at around the time when the temperature value detected by the temperature sensor 53 exceeds a fixed threshold temperature TTHL9, the heat finally starts to be detected by the temperature sensor 54. The fixed temperature threshold is, for example, a temperature at which data stored in the memory channel could be corrupted. By detecting the heat by the temperature sensor 53 located near the high temperature part and thereby changing the refresh cycle before the temperature sensor 54 detects the heat, data corruption can be prevented. Note that it is conceivable to employ a method in which the temperature threshold is set to a lower value in advance and the control for the memory channel is performed when the heat is detected by the temperature sensor 54. However, in such a method, the refresh cycle is frequently changed, thus causing a problem that the power consumption of the semiconductor chip increases. In this embodiment, it is possible to set the temperature threshold to a higher value, thus making it possible to prevent unnecessary refresh operations and thereby reduce the power consumption of the semiconductor chip.

Third Embodiment

Figure 14:
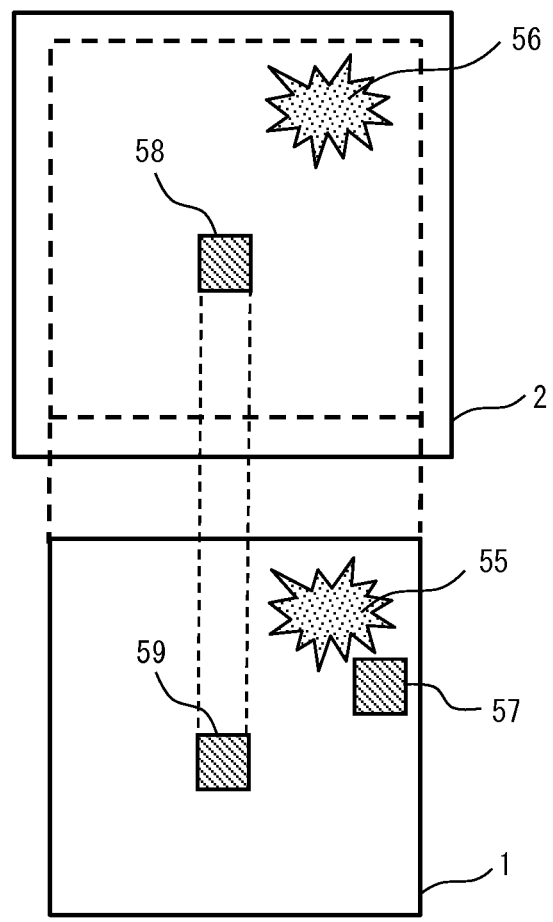
FIG. 14 is a diagram showing an example of an arrangement of a temperature sensor and an auxiliary temperature sensor of a semiconductor device according to a third embodiment.

FIG. 14 shows a state in a semiconductor device according to a second embodiment of the present invention in which heat from a logic chip is transferred to a DRAM chip, and also shows another example of a temperature sensor arrangement. The logic chip 1 and the DRAM chip 2 are stacked on top of one another. The configuration of each of the chips is similar to that in the first embodiment. When the logic chip 1 has a high temperature, the heat first propagates to a place 56 in the DRAM chip 2 that corresponds to the high temperature part 55 in the logic chip 1. Note that the DRAM chip 2 is located above/below the logic chip 1. Therefore, to appropriately protect the DRAM chip, it is desirable to dispose a temperature sensor 57 in or near the high temperature part 55 of the logic chip. Further, a temperature sensor 58 is disposed in the DRAM chip 2 and an auxiliary temperature sensor 59 is dispose in a place in the logic chip 1 that is located directly above/below the temperature sensor 58. A temperature sensor controller (not shown in FIG. 14) obtains a temperature difference δT from temperatures detected by the temperature sensor 58 and the auxiliary temperature sensor 59. Then, the temperature sensor controller adds or subtracts the temperature difference δT to or from a temperature detected by the temperature sensor 57. In this way, it is possible to obtain the temperature of the high temperature part 56 in the DRAM chip 2 more accurately from the temperature value of the temperature sensor 57 of the semiconductor chip 1, thus making it possible to accurately perform control like the one performed in the first embodiment.

The present invention made by the inventors has been explained above in a specific manner based on embodiments. However, the present invention is not limited to the above-described embodiments, and needless to say, various modifications can be made without departing from the spirit and scope of the present invention.

For example, the semiconductor device according to the above-described embodiment may have a configuration in which the conductivity type (p-type or n-type) of the semiconductor substrate, the semiconductor layer, the diffusion layer (diffusion region), and so on may be reversed. Therefore, when one of the n-type and p-type is defined as a first conductivity type and the other is defined as a second conductivity type, the first and second conductivity types may be the p-type and n-type, respectively. Alternatively, the first and second conductivity types may be the n-type and p-type, respectively.

The first and second embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
   a first semiconductor chip; and
   a second semiconductor chip coupled to the first semiconductor chip, wherein:
   the first semiconductor chip comprises a memory circuit comprising a plurality of memory areas each of which comprises memory cells, and
   the second semiconductor chip comprises:
   a plurality of temperature sensors disposed in mutually different places in the second semiconductor chip, each of the plurality of temperature sensors being configured to measure a temperature in the second semiconductor chip; and
   a memory controller that comprises a refresh cycle determination circuit and controls the plurality of memory areas of the memory circuit of the first semiconductor chip based on output results output from the plurality of temperature sensors,
   wherein the refresh cycle determination circuit is configured to calculate a maximum difference in temperatures by considering all the possible combinations among the output results of the plurality of temperature sensors and to determine a refresh cycle of the plurality of memory areas based on the calculated maximum difference in temperatures, and
   wherein the plurality of temperature sensors comprise at least three temperature sensors.

2. The semiconductor device according to claim 1, wherein the memory controller sends an instruction to the first semiconductor chip, the instruction being for instructing to refresh each of the plurality of memory areas based on an output result of a respective one of the plurality of temperature sensors.

3. The semiconductor device according to claim 1, wherein the memory controller determines the refresh cycle based on an output result of a respective one of the plurality temperature sensors, a respective one of the plurality of memory areas being refreshed in the determined refresh cycle.

4. The semiconductor device according to claim 1, wherein the first and second semiconductor chips are coupled to each other through a silicon through-electrode.

5. The semiconductor device according to claim 1, further comprising a wiring line, wherein
the first and second semiconductor chips are arranged so that they do not overlap each other in planar view, and
the semiconductor device further comprises a wiring substrate on which the first and second semiconductor chips are coupled to each other through the wiring line.

6. The semiconductor device according to claim 1, wherein the first and second semiconductor chips are arranged in such a manner that their main surfaces are opposed to each other so that, for each of the plurality of temperature sensors, one of the plurality of memory areas is located in a place aligned with that temperature sensor in a direction perpendicular to the main surface of the first semiconductor chip.

7. The semiconductor device according to claim 1, wherein each of the plurality of temperature sensors includes a switch circuit that associates that temperature sensor with at least one of the plurality of memory areas.

8. The semiconductor device according to claim 1, wherein a gate length of at least one of transistors forming the memory controller is longer than a gate length of at least one of transistors forming the memory cells.

9. The semiconductor device according to claim 1, wherein a gate length of at least one of transistors forming the memory controller is shorter than a gate length of at least one of transistors forming the memory cells.

10. The semiconductor device according to claim 1, wherein the second semiconductor chip further comprises a plurality of logic circuits and the plurality of temperature sensors are provided so as to correspond to the plurality of logic circuits.

11. The semiconductor device according to claim 1, wherein the memory controller determines the refresh cycle of the plurality of memory areas based on the maximum difference in temperatures.

12. The semiconductor device according to claim 11, wherein the second semiconductor chip further comprising a refresh mode setting circuit configured to set a refresh mode for the memory area based on the maximum difference in temperatures, wherein in a case where a first refresh mode is set, when the maximum difference in temperatures is equal to or smaller than a first threshold value, the refresh mode setting circuit maintains the first refresh mode, whereas when the maximum difference in temperatures is larger than the first threshold value, the refresh mode setting circuit changes the refresh mode from the first refresh mode to a second refresh mode.

13. The semiconductor device according to claim 1, wherein the memory controller includes a plurality of refresh cycle determination circuits corresponding to each of the memory areas in the first semiconductor chip,
wherein the second semiconductor chip further comprises a thermal sensor controller including a switch circuit that associates the temperature sensor with at least one of refresh cycle determination circuits in the second semiconductor chip.

14. The semiconductor device according to claim 1, wherein the first semiconductor chip is disposed to overlap with the second semiconductor chip in planer view,
wherein the memory controller controls a first memory area of the plurality of memory areas based on an output result from a first temperature sensor of the plurality of temperature sensors, and
wherein the first temperature sensor overlaps the first memory area.

15. A semiconductor device provided on a first semiconductor substrate, the semiconductor device being coupled to a memory circuit provided on a second semiconductor substrate different from the first semiconductor substrate, the semiconductor device comprising:
a logic circuit that performs a desired operation;
a plurality of temperature sensors disposed in different places in the first semiconductor substrate, each of the plurality of temperature sensors measures a temperature in the first semiconductor substrate; and
a memory controller that comprises a refresh cycle determination circuit and controls a memory area located in the memory circuit based on output results of the plurality of temperature sensors and temperature information received from the memory circuit,
wherein the refresh cycle determination circuit is configured to calculate a maximum difference in temperatures by considering all the possible combinations among the output results of the plurality of temperature sensors and to determine a refresh cycle of the memory area based on the calculated maximum difference in temperatures, and
wherein the plurality of temperature sensors comprise at least three temperature sensors.

16. The semiconductor device according to claim 15, wherein the memory controller comprises:
a register that holds a value indicating a refresh cycle for the memory area;
a refresh cycle determination circuit that compares a value of the output result of the temperature sensor with a value of the temperature information received from the memory circuit, and sets a first value to the register when the value of the output result is larger than the value of the temperature information and sets a second value to the register when the value of the output result is smaller than the value of the temperature information; and
a scheduler that sends an instruction to the memory circuit, the instruction being for instructing to refresh the memory area in the refresh cycle specified by the value held in the register.

17. The semiconductor device according to claim 15, wherein
the plurality of temperature sensors comprise a first temperature sensor and a second temperature sensor, and
the semiconductor device further comprises:
a circuit that calculates a difference between an output value from the first temperature sensor and an output value from the second temperature sensor;
a circuit that outputs a maximum value of results of the calculation; and a register that stores information for correcting the refresh cycle based on the maximum value.

18. The semiconductor device according to claim 17, further comprising a refresh mode setting circuit that sets a refresh mode for the memory area based on the maximum value.

19. The semiconductor device according to claim 18, wherein in a case where a first refresh mode is set, when the maximum value is equal to or smaller than a first threshold value, the refresh mode setting circuit maintains the first refresh mode, whereas when the maximum value is larger than the first threshold value, the refresh mode setting circuit changes the refresh mode from the first refresh mode to a second refresh mode.

20. The semiconductor device according to claim 18, wherein in a case where a first refresh mode is set, when the maximum value is equal to or smaller than a first threshold value, the refresh mode setting circuit changes the refresh mode from the first refresh mode to a second refresh mode.

21. The semiconductor device according to claim 15, wherein at least one temperature difference is calculated from an output result of a temperature sensor among the plurality of temperature sensors and the temperature information received from the memory circuit, and the at least one temperature difference is added to or subtracted from an output result of another temperature sensor, other than the temperature sensor, of the semiconductor device.

22. A semiconductor device comprising:
a logic circuit that performs a desired operation;
a plurality of temperature sensors that measure temperatures in the vicinity of the logic circuit;
a power controller that controls a power consumption of the logic circuit based on an output results from the plurality of temperature sensors; and
a memory controller that comprises a refresh cycle determination circuit and controls a memory area based on the output results from the plurality of temperature sensors,
wherein the refresh cycle determination circuit is configured to calculate a maximum difference in temperatures by considering all the possible combinations among the output results of the plurality of temperature sensors and to determine a refresh cycle of the memory area based on the calculated maximum difference in temperatures, and
wherein the plurality of temperature sensors comprise at least three temperature sensors.

23. The semiconductor device according to claim 22, wherein the memory controller comprises:
a register that holds a value indicating a refresh cycle for the memory area;
a refresh cycle determination circuit that compares a value of an output result of a temperature sensor among the plurality of temperature sensors with a value of the temperature information received from the memory circuit, and sets a first value to the register when the value of the output result is larger than the value of the temperature information and sets a second value to the register when the value of the output result is smaller than the value of the temperature information; and
a scheduler that sends an instruction to the memory circuit, the instruction being for instructing to refresh the memory area in the refresh cycle specified by the value held in the register,
wherein the power controller reduces the power consumption of the logic circuit when the value of the output result of the temperature sensor is equal to or larger than a third value.

* * * * *